United States Patent
Manning

[11] Patent Number: 6,057,198
[45] Date of Patent: *May 2, 2000

[54] SEMICONDUCTOR PROCESSING METHOD OF FORMING A BURIED CONTACT

[75] Inventor: Monte Manning, Kuna, Id.

[73] Assignee: Micron Technology, Inc., Boise, Id.

[*] Notice: This patent is subject to a terminal disclaimer.

[21] Appl. No.: 09/087,133

[22] Filed: May 29, 1998

Related U.S. Application Data

[63] Continuation of application No. 08/567,916, Dec. 6, 1995, Pat. No. 5,773,346.

[51] Int. Cl.$^7$ .................................................. H01L 21/335
[52] U.S. Cl. .................. 438/297; 438/299; 438/586; 438/597; 438/657; 438/564
[58] Field of Search .................. 438/225, 233, 438/439, 452, 533, 586, 597, 647, 657; FOR 346, 297, 299, 564; 257/377

[56] References Cited

U.S. PATENT DOCUMENTS

| | | | |
|---|---|---|---|
| 3,936,331 | 2/1976 | Luce et al. | 156/17 |
| 4,282,648 | 8/1981 | Yu et al. | 438/233 |
| 4,397,076 | 8/1983 | Honnigford et al. | 29/571 |
| 4,608,748 | 9/1986 | Noguchi et al. | 29/571 |
| 4,724,471 | 2/1988 | Leuschner | 357/23.13 |
| 4,871,688 | 10/1989 | Lowrey | 437/47 |
| 4,992,389 | 2/1991 | Ogura et al. | 437/41 |
| 5,071,781 | 12/1991 | Seo et al. | 437/47 |
| 5,087,951 | 2/1992 | Chance et al. | 357/23.6 |
| 5,100,838 | 3/1992 | Dennison | 437/195 |
| 5,140,551 | 8/1992 | Chiu | 365/185 |
| 5,150,276 | 9/1992 | Gonzalez et al. | 361/313 |
| 5,166,770 | 11/1992 | Tang et al. | 257/770 |
| 5,326,722 | 7/1994 | Huang | 437/186 |
| 5,378,641 | 1/1995 | Cheffings | 437/35 |
| 5,422,295 | 6/1995 | Choi et al. | 437/525 |
| 5,451,534 | 9/1995 | Yang | 437/52 |
| 5,681,778 | 10/1997 | Manning | 437/186 |
| 5,773,346 | 6/1998 | Manning | 438/297 |

FOREIGN PATENT DOCUMENTS

| | | | |
|---|---|---|---|
| 81/02493 | 9/1981 | WIPO | 438/FOR. 346 |

Primary Examiner—T. N. Quach
Attorney, Agent, or Firm—Wells, St. John, Roberts, Gregory & Matkin, P.S.

[57] ABSTRACT

A semiconductor processing method of forming a buried contact to a substrate region includes, a) providing a stress relief layer over a bulk semiconductor substrate; b) etching the stress relief layer to expose a desired buried contact area of the substrate; c) masking over the stress relief layer and over the desired buried contact area; d) with the masking in place, exposing the substrate to oxidation conditions effective to grow field oxide regions in unmasked areas of the substrate; e) after forming the field oxide regions, removing the masking from the substrate and effectively leaving the buried contact area exposed; f) providing a layer of electrically conductive material over field oxide and exposed buried contact area; and g) patterning the conductive material layer into a conductive line which overlies both field oxide and the buried contact area.

33 Claims, 7 Drawing Sheets

SEMICONDUCTOR PROCESSING METHOD OF FORMING A BURIED CONTACT

RELATED PATENT DATA

This patent resulted from a continuation application of U.S. patent application Ser. No. 08/567,916, which was filed on Dec. 6, 1995, U.S. Pat. No. 5,773,346.

TECHNICAL FIELD

This invention relates to semiconductor processing methods of forming buried contacts and to methods of making ohmic contact between a transistor gate line and a substrate diffusion region.

BACKGROUND OF THE INVENTION

Single semiconductor devices are grouped into integrated circuits, which in turn are further densified into large scale integrated semiconductor systems. The trend in semiconductor integrated circuitry fabrication continues to involve a decrease in the size of individual structures. However, this has been accompanied by an increase in the complexity and number of such structures aggregated on a single semiconductor integrated chip.

Figure 1:
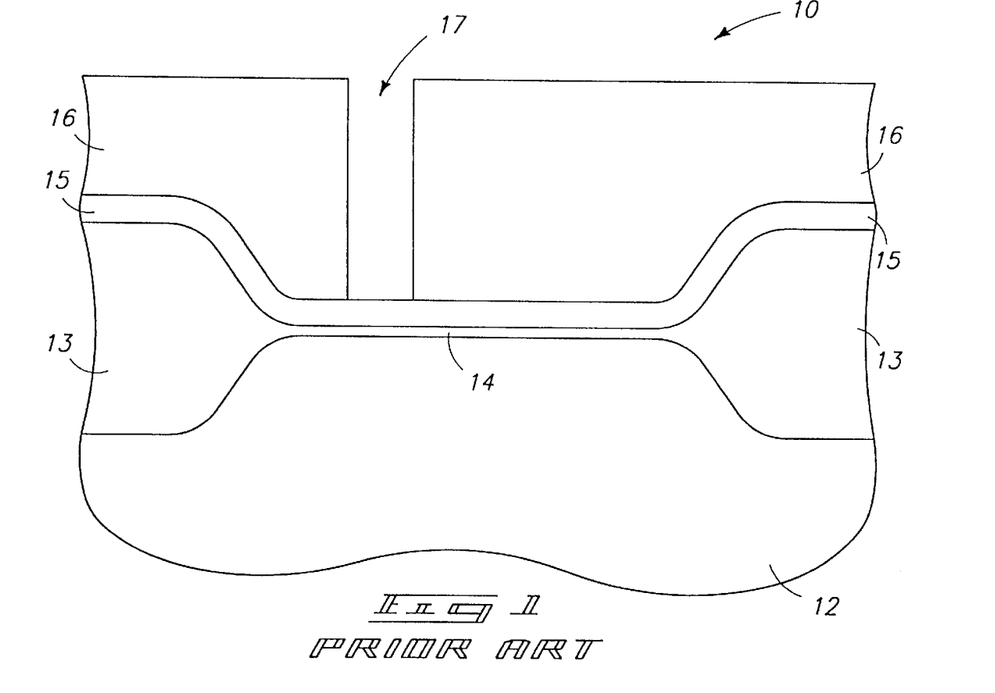
FIG. 1 is a diagrammatic sectional view of a prior art semiconductor wafer fragment at one prior art processing step, and is discussed in the "Background" section above.

One type of integrated circuitry comprises memory circuitry. This invention arose out of problems or challenges inherent in producing a particular type of memory circuitry, namely static random access memory (SRAMs). Such circuitry typically interconnects a gate of one transistor device to a diffusion area of another transistor device in a semiconductor substrate. One typical prior art method of accomplishing such fabrication and interconnection is described with reference to FIGS. 1–4. FIG. 1 illustrates a semiconductor wafer fragment 10 in process comprised of a bulk substrate region 12 and field oxide regions 13. A gate oxide layer 14 overlies silicon substrate 12. A polysilicon layer 15 is provided over field oxide regions 13 and gate oxide layer 14. Such will be utilized for fabrication of a transistor gate line of associated SRAM circuitry. A layer 16 of photoresist is provided atop the substrate, and provided with a patterned opening 17 therein.

Figure 2:
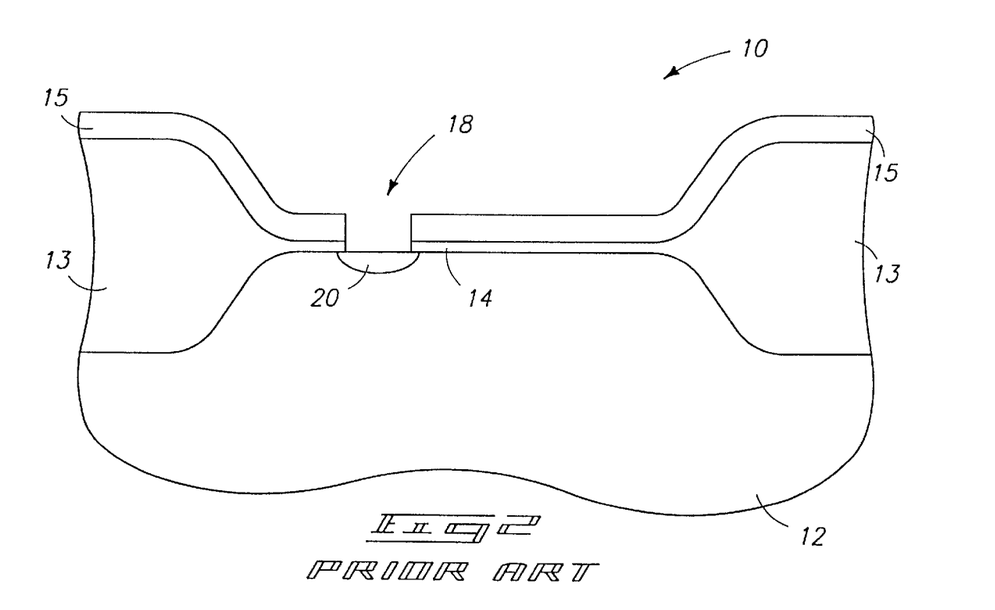
FIG. 2 is a view of the FIG. 1 prior art wafer fragment at a prior art processing step subsequent to that shown by FIG. 1.

Referring to FIG. 2, a contact opening 18 to bulk substrate 12 has been etched through polysilicon layer 15 and gate oxide layer 14. A desired diffusion region 20 can be provided as shown. Then, the photoresist layer 16 of FIG. 1 is stripped.

Figure 3:
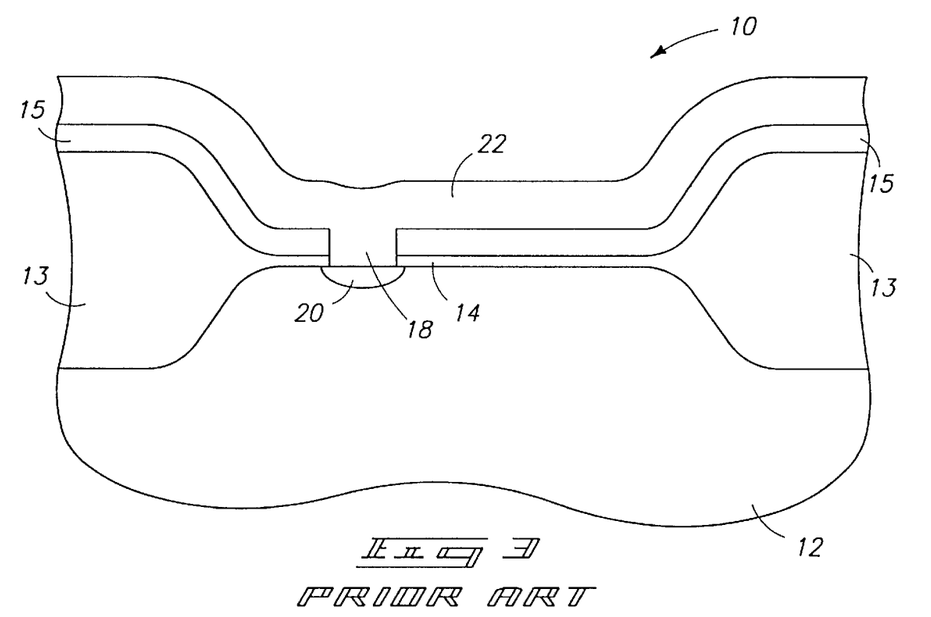
FIG. 3 is a view of the FIG. 1 prior art wafer fragment at a prior art processing step subsequent to that shown by FIG. 2.

Referring to FIG. 3, a subsequent polysilicon layer 22 is deposited over first polysilicon layer 15 and to within contact opening 18.

Figure 4:
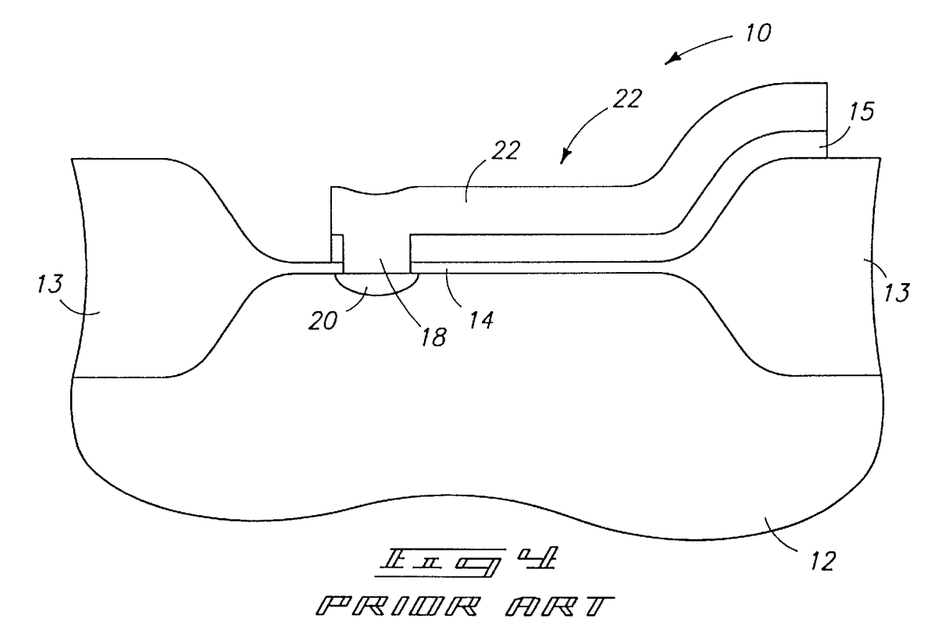
FIG. 4 is a view of the FIG. 1 prior art wafer fragment at a prior art processing step subsequent to that shown by FIG. 3.

Referring to FIG. 4, layers 22 and 15 are patterned and etched to produce the illustrated transistor gate line 24 which extends over and ohmically connects with diffusion region 20.

Although the invention arose out of concerns associated with achieving the above described SRAM interconnect, the artisan will appreciate applicability of the invention to other semiconductor fabrication techniques resulting in formation of buried contacts. Prior art buried contact techniques typically provide field oxide and associated devices fabricated relative to substrate active area. An insulating dielectric layer is subsequently deposited, with contact openings being patterned therethrough to desired diffusion regions within the active area, or to other device components. Aspects of this invention depart from such prior art techniques, with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a buried contact to a substrate region comprises the following steps:

providing a stress relief layer over a bulk semiconductor substrate;

etching the stress relief layer to expose a desired buried contact area of the substrate;

masking over the stress relief layer and over the desired buried contact area;

with the masking in place, exposing the substrate to oxidation conditions effective to grow field oxide regions in unmasked areas of the substrate;

after forming the field oxide regions, removing the masking from the substrate and effectively leaving the buried contact area exposed;

providing a layer of electrically conductive material over field oxide and exposed buried contact area; and patterning the conductive material layer into a conductive line which overlies both field oxide and the, buried contact area.

In accordance with another aspect of the invention, a semiconductor processing method of making ohmic contact between a transistor gate line and a substrate diffusion region comprises the following steps:

providing a stress relief layer over a bulk semiconductor substrate;

etching the stress relief layer to expose a desired first area of the bulk semiconductor substrate;

providing an oxidation masking layer over the stress relief layer and exposed first area;

patterning and etching the oxidation masking layer to cover desired substrate active areas and leave desired substrate field oxide areas exposed, the etched oxidation masking layer overlying at least a portion of the first area;

exposing the substrate to oxidation conditions effective to grow field oxide regions in the unmasked field oxide areas;

after field oxide formation, etching the oxidation masking layer from the substrate and effectively leaving the unoxidized first area exposed, the unoxidized first area effectively defining a buried contact opening area to the bulk semiconductor substrate;

providing an electrically conductive transistor gate layer over the field oxide regions and buried contact opening area;

patterning the gate layer into a transistor gate line which overlies both field oxide and the buried contact area; and providing conductivity enhancing impurity into the bulk substrate beneath the buried contact area to define a substrate diffusion region, the patterned gate line being in ohmic electrical communication with the diffusion region.

Figure 5:
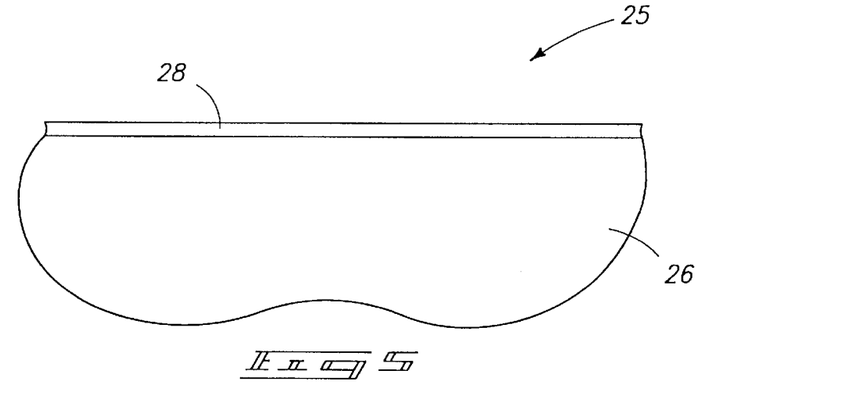
FIG. 5 is a diagrammatic sectional view of a semiconductor wafer fragment at one processing step in accordance with the invention.

Referring to FIGS. 5–11, and first to FIG. 5, a semiconductor wafer fragment in process in accordance with the invention is indicated generally with reference numeral 25. Such comprises a bulk semiconductor substrate 26 (preferably monocrystalline silicon) having a stress relief layer 28 provided thereover. Layer 28 preferably comprises a pad oxide or gate oxide layer deposited or grown to an example nominal thickness of 120 Angstroms.

Figure 6:
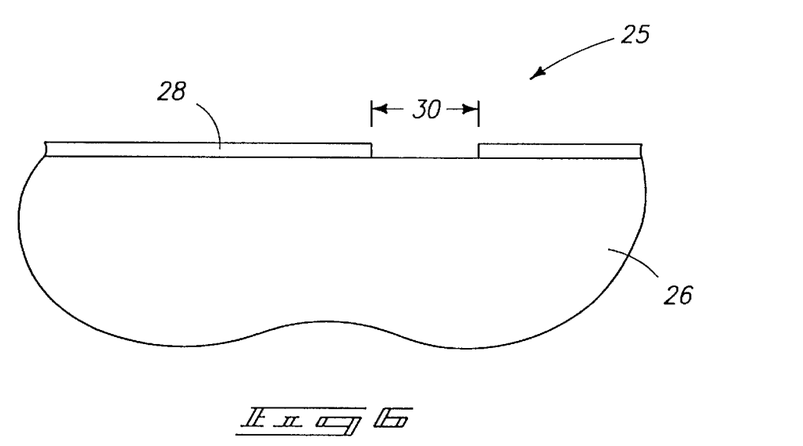
FIG. 6 is a view of the FIG. 5 wafer fragment at a processing step subsequent to that shown by FIG. 5.

Referring to FIG. 6, stress relief layer 28 is patterned and etched to expose a desired first area 30 of bulk semiconductor substrate 26.

Figure 7:
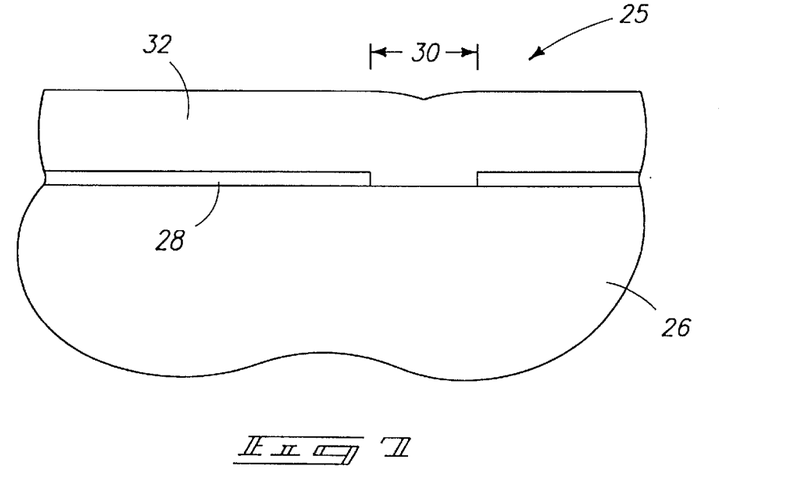
FIG. 7 is a view of the FIG. 5 wafer fragment at a processing step subsequent to that shown by FIG. 6.

Referring to FIG. 7, an oxidation masking layer 32 is provided over stress relief layer 28 and exposed first area 30. Layer 32 preferably comprises a nitride, such as $Si_3N_4$ deposited to an example nominal thickness of 1900 Angstroms.

Figure 8:
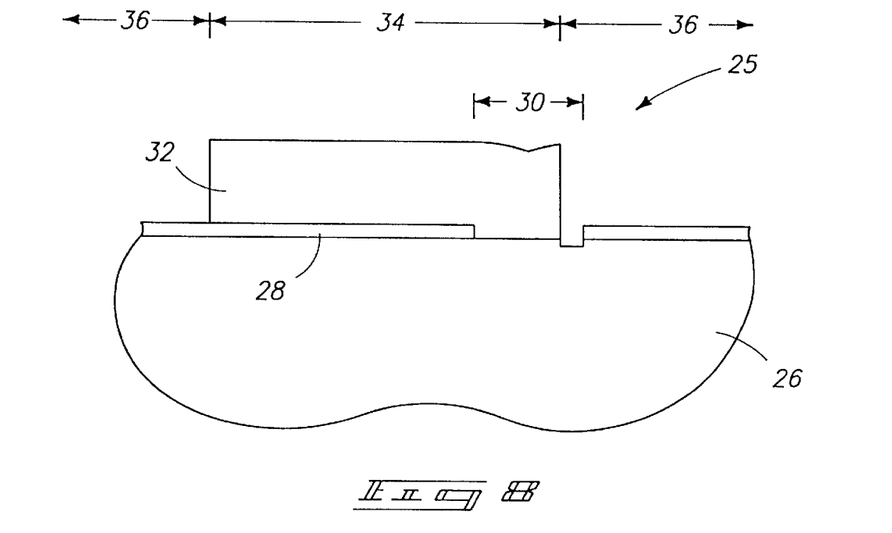
FIG. 8 is a view of the FIG. 5 wafer fragment at a processing step subsequent to that shown by FIG. 7.

Referring to FIG. 8, oxidation masking layer 32 is patterned and etched to cover desired substrate active areas 34 and leave desired substrate field oxide areas 36 exposed. Etched oxidation masking layer 32 overlies at least a portion of first area 30, with in the preferred embodiment etched layer 32 overlying only a portion (i.e., not all) of first area 30. The etching of oxidation masking layer 32 will also typically etch into bulk semiconductor substrate 26 to a degree, as shown.

Figure 9:
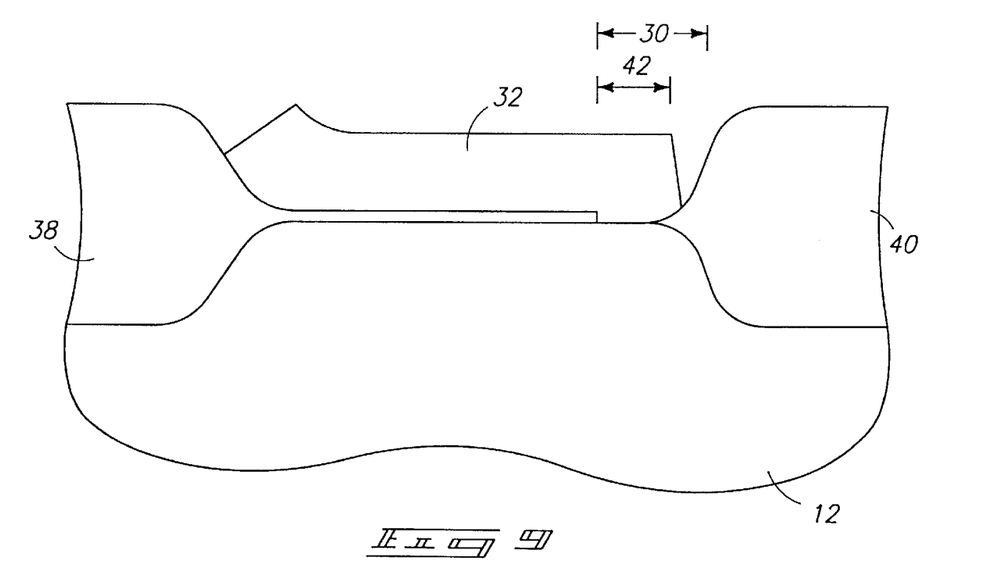
FIG. 9 is a view of the FIG. 5 wafer fragment at a processing step subsequent to that shown by FIG. 8.

Referring to FIG. 9, fragment 25 is exposed to oxidation conditions effective to grow field oxide regions 38 and 40 in unmasked field oxide areas 36. Provision of patterned masking layer 32 to only cover a portion of first area 30, and thus terminate over silicon of substrate 26, results, in less "bird's beak" encroachment for field oxide region 40 relative to active area than occurs with field oxide region 38. Conventional LOCOS oxidation conditions can be used, such as 950° C. in a steam ambient for 2 hours to grow 3200 Angstroms of oxide. Such effectively leaves an unoxidized portion 42 of first area 30.

Figure 10:
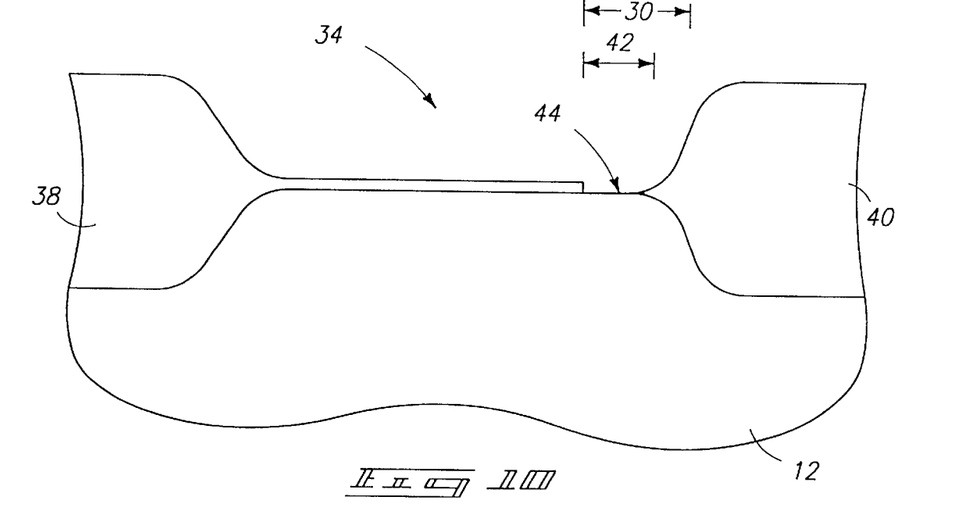
FIG. 10 is a view of the FIG. 5 wafer fragment at a processing step subsequent to that shown by FIG. 9.

Referring to FIG. 10, oxidation masking layer 32 is etched or otherwise removed from substrate 26, leaving unoxidized first area 42 exposed. Unoxidized first area 42 effectively defines a buried contact opening area 44 to bulk semiconductor substrate 26. Accordingly in this described embodiment, buried contact opening area 44 comprises less than all of first area 30. Further and advantageously, buried contact 44 is formed to be self-aligned to the edge of active area 34 and field oxide region 40.

Figure 11:
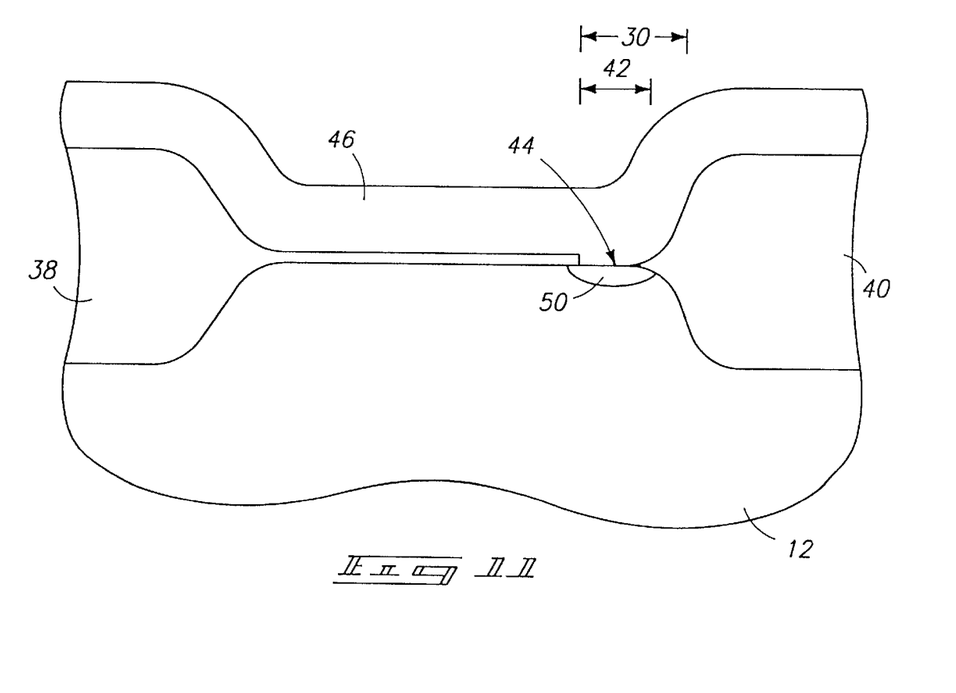
FIG. 11 is a view of the FIG. 5 wafer fragment at a processing step subsequent to that shown by FIG. 10.

Referring to FIG. 11, an electrically conductive transistor gate layer 46 is provided over field oxide regions 40 and 38, and buried contact area 44. An example and preferred material for layer 46 is conductively doped polysilicon deposited to an example nominal thickness of 2000 Angstroms. Contact area 44 is preferably cleaned with dilute HF (i.e., 100:1 by volume for 15 seconds) prior to layer 46 deposition to remove any native oxide.

Figure 12:
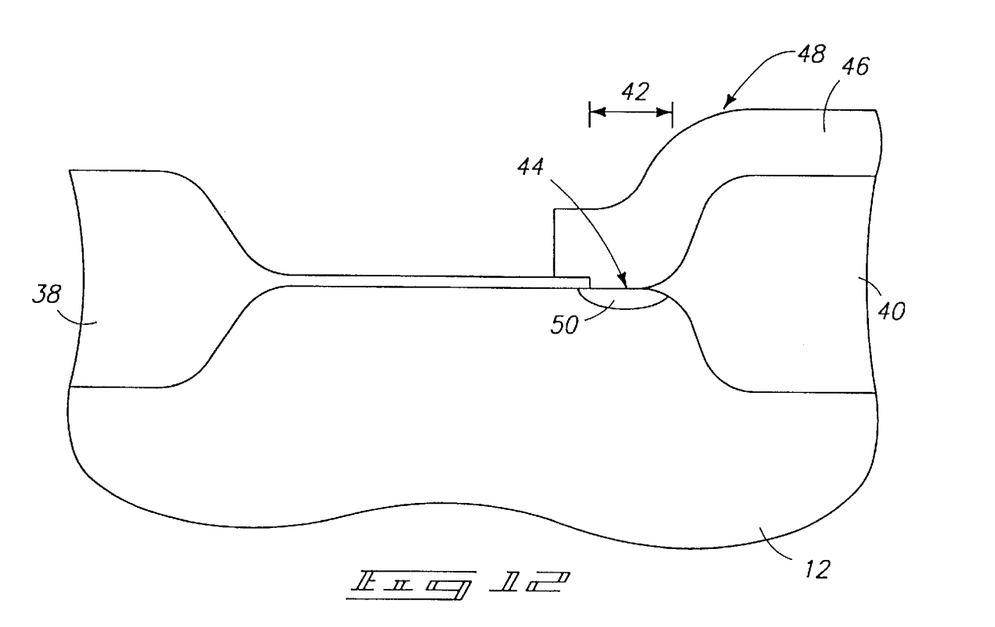
FIG. 12 is a view of the FIG. 5 wafer fragment at a processing step subsequent to that shown by FIG. 11.

Referring to FIG. 12, gate layer 46 has been patterned into a conductive transistor gate line 48 which overlies both of field oxide 40 and buried contact area 44. Conductivity enhancing impurity is provided into bulk substrate 26 beneath buried contact area 44 to define a substrate diffusion region 50. Thus, patterned gate line 48 is in ohmic electrical connection with diffusion region 50.

Diffusion region 50 might be provided by a number of manners either before or after provision of electrically conductive transistor gate layer 46. For example, diffusion region 50 could be provided by a dedicated masking and implant step, or in association with other desired implants, in advance of layer 46 deposition. Alternately where layer 46 comprises semiconductive material such as polysilicon which is heavily and effectively conductively doped with a conductivity enhancing impurity (i.e. greater than or equal to $1 \times 10^{20}$ ions/$cm^3$), diffusion region 50 might be provided essentially entirely a result of out-diffusion of such conductivity enhancing impurity from gate layer 46. Such would typically occur as the result of subsequent heating in inherent wafer processing. Alternately, a dedicated anneal at for example 900° C. for 30 minutes could be utilized to drive dopant sufficiently into bulk substrate 26 to form diffusion region 50. Further alternately, diffusion region 50 might be provided by a combination of the above described implant and out-diffusion steps.

The above described process provides an improvement over the described prior art process in that separate multiple polysilicon depositions are avoided.

Figure 13:
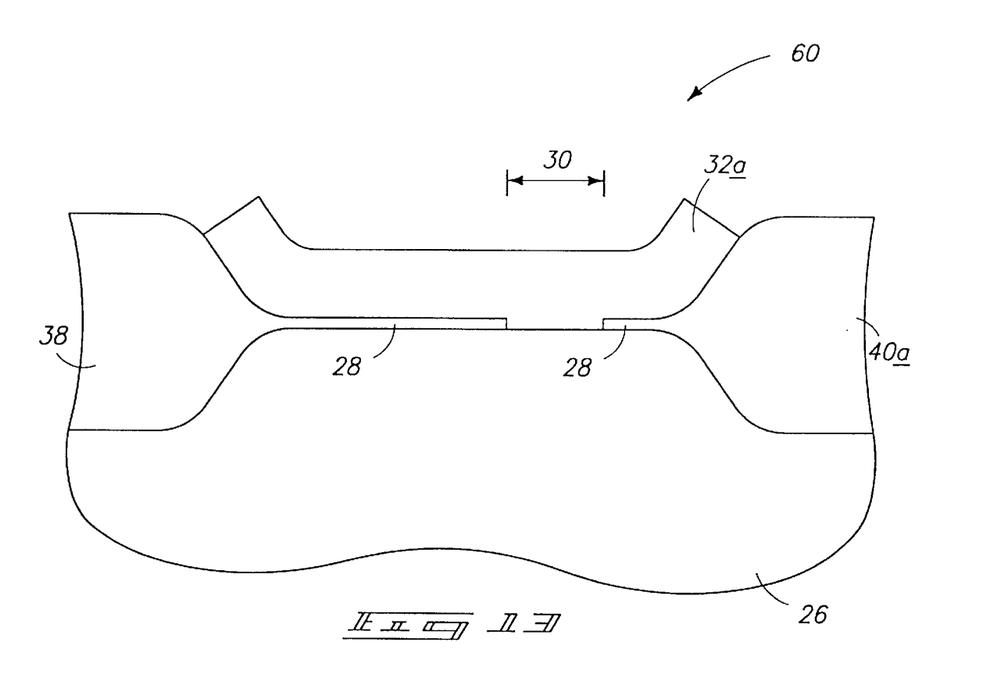
FIG. 13 is a diagrammatic sectional view of an alternate embodiment semiconductor wafer fragment at one alternate processing step in accordance with the invention.

An alternate method in accordance with the invention is described with reference to FIGS. 13 and 14, where a semiconductor wafer fragment in process is indicated with reference numeral 60. Like numerals from the first described embodiment are utilized where appropriate with differences being indicated by the suffix "a", or with different numerals. Different from the first described embodiment, patterned and etched oxidation masking layer 32a overlies all of exposed first area 30, extending laterally outward therebeyond. Subsequent oxidation produces the illustrated field oxide regions 38 and 40a.

Figure 14:
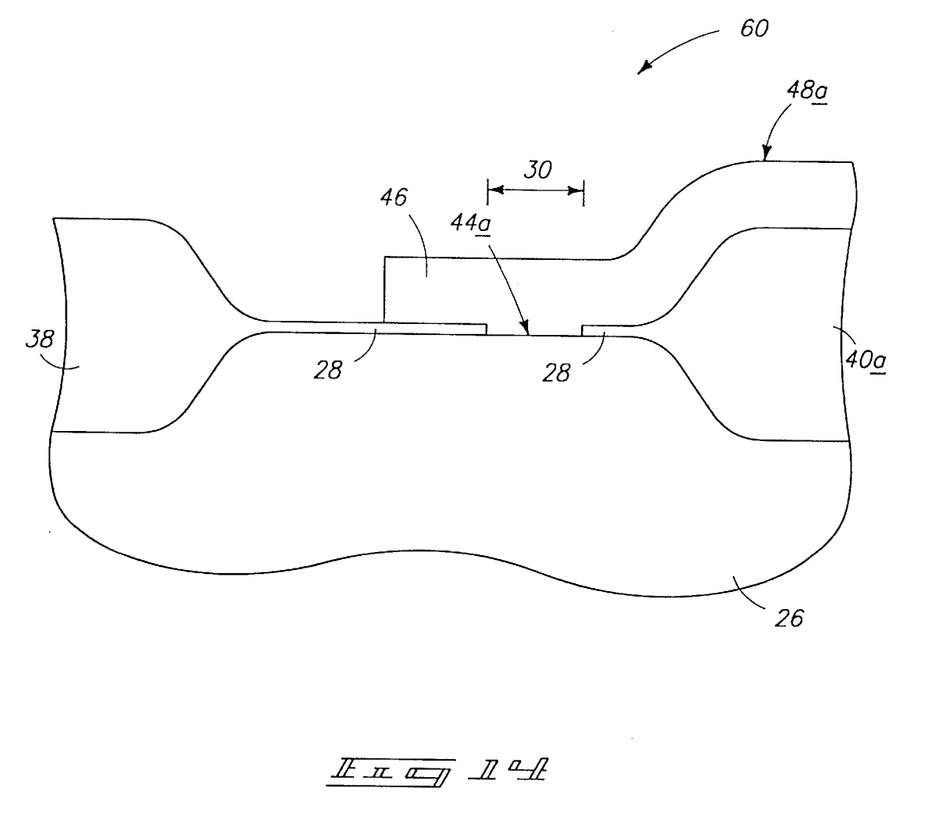
FIG. 14 is a view of the FIG. 13 wafer fragment at a processing step subsequent to that shown by FIG. 13.

FIG. 14 illustrates subsequent deposition and patterning of the polysilicon layer 46 to produce a line 48a. Thus in this described embodiment, buried contact opening 44a is larger than contact opening 44 of the first described embodiment, effectively comprising all of first area 30.

The above described preferred embodiments have been with respect to making ohmic contact between a transistor gate line and a substrate diffusion region. The artisan will however appreciate applicability of the invention to forming any buried contact prior to field oxidation, with the field oxidation mask also effectively masking a desired buried contact area on a bulk semiconductor substrate. Removal of the oxidation masking layer enables subsequent provision of a conductive line layer to overlie the buried contact area, and thus make electrical connection therewith.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming electrical contact between a an electrically conductive line and a substrate diffusion region location, comprising:

forming an opening through a stress relief layer and to a diffusion region location in a semiconductive material substrate;

after forming the opening, forming an oxidation masking layer over the stress relief layer and oxidizing portions of the substrate proximate the oxidation masking layer to form field oxide regions proximate the stress relief layer and over the substrate;

removing the oxidation masking layer; and forming an electrically conductive line over the stress relief layer, over the field oxide regions, and in electrical contact with the diffusion region location.

2. The method of claim 1 further comprising providing a dopant in the diffusion region location to define a diffusion region in the diffusion region location.

3. The method of claim 1 wherein the electrically conductive line comprises polysilicon.

4. A semiconductor processing method of forming electrical contact between a transistor gate line and a substrate diffusion region location, comprising:

forming an opening through a stress relief layer and to a diffusion region location in a semiconductive material substrate;

forming an oxidation masking layer over the stress relief layer and oxidizing portions of the substrate proximate the oxidation masking layer to form field oxide regions proximate the stress relief layer and over the substrate;

removing the oxidation masking layer; and forming a silicon-comprising gate line over the stress relief layer, over the field oxide regions, and in electrical contact with the diffusion region location, the forming the silicon-comprising gate line comprising no more than one deposition of silicon material.

5. A semiconductor processing method of forming electrical contact between a transistor gate line and a substrate diffusion region location, comprising:

forming an opening through a stress relief layer and to a diffusion region location in a semiconductive material substrate, the substrate comprising silicon;

forming an oxidation masking layer over the stress relief layer and within at least a portion of the opening, the oxidation masking layer covering a portion of the semiconductive material substrate and leaving another portion of the semiconductive material substrate uncovered;

growing field oxide over the uncovered portion of the semiconductive material substrate by oxidizing the silicon-comprising substrate;

after growing the field oxide, removing the oxidation masking layer from within the opening;

after removing the oxidation masking layer, providing an electrically conductive transistor gate layer over the field oxide and within the opening; and patterning the gate layer into a transistor gate line which overlies the field oxide and is in electrical contact with the diffusion region location.

6. The semiconductor processing method of claim 5 further comprising providing conductivity enhancing impurity into the substrate to define a substrate diffusion region in the diffusion region location, the electrically conductive gate layer comprises a semiconductive material effectively conductively doped with a conductivity enhancing impurity, the step of providing the conductivity enhancing impurity into the substrate comprising out-diffusion of conductivity enhancing impurity from the gate layer into the substrate.

7. The semiconductor processing method of claim 5 further comprising providing conductivity enhancing impurity into the substrate to define a substrate diffusion region in the diffusion region location, the electrically conductive gate layer comprises a semiconductive material effectively conductively doped with a conductivity enhancing impurity, the step of providing the conductivity enhancing impurity into the substrate consisting essentially of out-diffusion of conductivity enhancing impurity from the gate layer into the substrate.

8. A semiconductor processing method of forming a buried contact to a substrate area comprising the following steps:

providing a stress relief layer over a bulk semiconductor substrate, the stress relief layer covering a portion of the substrate and leaving a desired buried contact area of the substrate exposed, the semiconductor substrate comprising monocrystalline silicon;

masking over the stress relief layer and over the desired buried contact area, and leaving areas of the substrate unmasked;

with the masking in place, forming field oxide regions in unmasked areas of the substrate by oxidizing monocrystalline silicon of the substrate;

after forming the field oxide regions, exposing the buried contact area;

providing a layer of electrically conductive material over the field oxide regions and the exposed buried contact area; and patterning the conductive material layer into a conductive line which overlies both field oxide and the buried contact area.

9. The semiconductor processing forming a buried contact of claim 8 wherein the field oxide regions abut substrate active area, the buried contact being formed to be self-aligned to an edge of the active area.

10. A semiconductor processing method of making electrical contact between a transistor gate line and a substrate buried contact area comprising the following steps:

providing a stress relief layer over a bulk semiconductor substrate, the stress relief layer leaving a desired first area of the bulk semiconductor substrate exposed, the semiconductor substrate comprising monocrystalline silicon;

providing an oxidation masking layer over the stress relief layer to cover desired substrate active areas and leave desired substrate field oxide areas exposed, the oxidation masking layer overlying at least a portion of the first area;

forming field oxide regions in the unmasked field oxide areas by oxidizing monocrystalline silicon of the substrate;

after field oxide formation, removing the oxidation masking layer from the substrate and effectively leaving the unoxidized first area exposed, the unoxidized first area effectively defining a buried contact opening area to the bulk semiconductor substrate;

providing an electrically conductive transistor gate layer over the field oxide regions and buried contact opening area;

patterning the gate layer into a transistor gate line which overlies both field oxide and the buried contact area, the patterned gate line being in electrical contact with the buried contact area.

11. The semiconductor processing method of claim 10 wherein the buried contact opening area comprises less than all of the first area.

12. The semiconductor processing method of claim 10 wherein the buried contact opening area comprises all of the first area.

13. The semiconductor processing method of claim 10 wherein the oxidation masking layer overlies only a portion of the first area.

14. The semiconductor processing method of claim 10 wherein the oxidation masking layer overlies all of the first area.

15. The semiconductor processing method of claim 10 further comprising providing conductivity enhancing impurity into the bulk substrate beneath the buried contact area to define a substrate diffusion region, the providing of the conductivity enhancing impurity into the substrate occurring before the step of providing the electrically conductive transistor gate layer.

16. The semiconductor processing method of claim 10 further comprising providing conductivity enhancing impurity into the bulk substrate beneath the buried contact area to define a substrate diffusion region, the providing of the conductivity enhancing impurity into the substrate occurring after the step of providing the electrically conductive transistor gate layer.

17. The semiconductor processing method of claim 10 further comprising providing conductivity enhancing impurity into the bulk substrate beneath the buried contact area to define a substrate diffusion region, the electrically conductive gate layer comprises a semiconductive material effectively conductively doped with a conductivity enhancing impurity, the step of providing the conductivity enhancing impurity into the substrate comprising out-diffusion of conductivity enhancing impurity from the gate layer into the substrate.

18. The semiconductor processing method of claim 10 further comprising providing conductivity enhancing impurity into the bulk substrate beneath the buried contact area to define a substrate diffusion region, the electrically conductive gate layer comprises a semiconductive material effectively conductively doped with a conductivity enhancing impurity, the step of providing the conductivity enhancing impurity into the substrate consisting essentially of out-diffusion of conductivity enhancing impurity from the gate layer into the substrate.

19. The semiconductor processing method of claim 10 wherein the buried contact is formed to be self-aligned to an edge of the active area.

20. The semiconductor processing method of claim 10 wherein the oxidation masking layer overlies only a portion of the first area, the step of providing the oxidation masking layer comprising patterning and etching the oxidation masking layer, the etching of the oxidation masking layer comprising etching into the bulk semiconductor substrate.

21. The semiconductor processing method of claim 10 wherein, the oxidation masking layer overlies only a portion of the first area, the step of providing the oxidation masking layer comprising patterning and etching the oxidation masking layer, the etching of the oxidation masking layer comprising etching into the bulk semiconductor substrate; and the buried contact is formed to be self-aligned to an edge of the active area.

22. The semiconductor processing method of claim 10 wherein the buried contact opening area comprises less than all of the first area; and further comprising providing conductivity enhancing impurity into the bulk substrate beneath the buried contact area to define a substrate diffusion region, the providing of the conductivity enhancing impurity into the substrate occurring before the step of providing the electrically conductive transistor gate layer.

23. The semiconductor processing method of claim 10 wherein the buried contact opening area comprises less than all of the first area; and further comprising providing conductivity enhancing impurity into the bulk substrate beneath the buried contact area to define a substrate diffusion region, the providing of the conductivity enhancing impurity into the substrate occurring after the step of providing the electrically conductive transistor gate layer.

24. The semiconductor processing method of claim 10 wherein the buried contact opening area comprises less than all of the first area; and further comprising providing conductivity enhancing impurity into the bulk substrate beneath the buried contact area to define a substrate diffusion region, the electrically conductive gate layer comprises a semiconductive material effectively conductively doped with a conductivity enhancing impurity, the step of providing the conductivity enhancing impurity into the substrate comprising out-diffusion of conductivity enhancing impurity from the gate layer into the substrate.

25. The semiconductor processing method of claim 10 wherein the buried contact opening area comprises less than all of the first area; and the buried contact is formed to be self-aligned to an edge of the active area.

26. The semiconductor processing method of claim 10 wherein the oxidation masking layer overlies only a portion of the first area; and further comprising providing conductivity enhancing impurity into the bulk substrate beneath the buried contact area to define a substrate diffusion region, the providing of the conductivity enhancing impurity into the substrate occurring before the step of providing the electrically conductive transistor gate layer.

27. The semiconductor processing method of claim 10 wherein the oxidation masking layer overlies only a portion of the first area; and further comprising providing conductivity enhancing impurity into the bulk substrate beneath the buried contact area to define a substrate diffusion region, the providing of the conductivity enhancing impurity into the substrate occurring after the step of providing the electrically conductive transistor gate layer.

28. The semiconductor processing method of claim 10 wherein the oxidation masking layer overlies only a portion of the first area; and further comprising providing conductivity enhancing impurity into the bulk substrate beneath the buried contact area to define a substrate diffusion region, the electrically conductive gate layer comprises a semiconductive material effectively conductively doped with a conductivity enhancing impurity, the step of providing the conductivity enhancing impurity into the substrate comprising out-diffusion of conductivity enhancing impurity from the gate layer into the substrate.

29. The semiconductor processing method of claim 10 wherein the oxidation masking layer overlies only a portion of the first area; and the buried contact is formed to be self-aligned to an edge of the active area.

30. The semiconductor processing method of claim 10 wherein the buried contact is formed to be self-aligned to an edge of the active area; and further comprising providing conductivity enhancing impurity into the bulk substrate beneath the buried contact area to define a substrate diffusion region, the providing of the conductivity enhancing impurity into the substrate occurring before the step of providing the electrically conductive transistor gate layer.

31. The semiconductor processing method of claim 10 wherein the buried contact is formed to be self-aligned to an edge of the active area; and further comprising providing conductivity enhancing impurity into the bulk substrate beneath the buried contact area to define a substrate diffusion region, the providing of the conductivity enhancing impurity into the substrate occurring after the step of providing the electrically conductive transistor gate layer.

32. The semiconductor processing method of claim 10 wherein the buried contact is formed to be self-aligned to an edge of the active area; and further comprising providing conductivity enhancing impurity into the bulk substrate beneath the buried contact area to define a substrate diffusion region, the electrically conductive gate layer comprises a semiconductive material effectively conductively doped with a conductivity enhancing impurity, the step of providing the conductivity enhancing impurity into the substrate comprising out-diffusion of conductivity enhancing impurity from the gate layer into the substrate.

33. A semiconductor processing method of making ohmic contact between a transistor gate line and a substrate diffusion region comprising the following steps:

providing a stress relief layer over a bulk semiconductor substrate, the stress relief layer comprising a pad oxide;

etching the stress relief layer to expose a desired first area of the bulk semiconductor substrate;

providing an oxidation masking layer over the stress relief layer to cover desired substrate active areas and leave desired substrate field oxide areas exposed, the oxidation masking layer overlying at least a portion of the first area and comprising silicon nitride;

exposing the substrate to oxidation conditions effective to grow field oxide regions in the unmasked field oxide areas;

after field oxide formation, removing the oxidation masking layer from the substrate and effectively leaving the unoxidized first area exposed, the unoxidized first area effectively defining a buried contact opening area to the bulk semiconductor substrate;

providing an electrically conductive transistor gate layer over the field oxide regions and buried contact opening area;

patterning the gate layer into a transistor gate line which overlies both field oxide and the buried contact area, the patterned gate line being in ohmic electrical communication with the buried contact area.

* * * * *

UNITED STATES PATENT AND TRADEMARK OFFICE
CERTIFICATE OF CORRECTION

PATENT NO : 6,057,198
DATED : May 2, 2000
INVENTOR(S) : H. Montgomery Manning

It is certified that error appears in the above-identified patent and that said Letters Patent are hereby corrected as shown below:

Col. 5, line 24
  delete "a".

Signed and Sealed this

Seventeenth Day of April, 2001

Attest:

NICHOLAS P. GODICI

*Attesting Officer*      *Acting Director of the United States Patent and Trademark Office*